(12) United States Patent
Endo et al.

(10) Patent No.: US 6,359,443 B1
(45) Date of Patent: Mar. 19, 2002

(54) DEVICE FOR DETECTING ABNORMALITY OF WIRE HARNESS FOR VEHICLE AND POWER SUPPLY DEVICE FOR VEHICLE

(75) Inventors: Takayoshi Endo; Goro Nakamura, both of Shizuoka (JP)

(73) Assignee: Yazaki Corp., Tokyo (JP)

( * ) Notice: Subject to any disclaimer, the term of this patent is extended or adjusted under 35 U.S.C. 154(b) by 0 days.

(21) Appl. No.: 09/112,358

(22) Filed: Jul. 9, 1998

(30) Foreign Application Priority Data

Jul. 11, 1997 (JP) .............................................. 9-186473

(51) Int. Cl.[7] .......................... H04B 3/46; G01R 31/00; G01K 3/00; G01K 7/00; G08C 19/16
(52) U.S. Cl. ...................... 324/539; 324/503; 374/111; 374/183; 340/870.17
(58) Field of Search ................................. 324/539, 503, 324/507, 550, 543; 374/111, 183, 185; 340/635, 870.16, 870.17

(56) References Cited

U.S. PATENT DOCUMENTS 3,588,776 A * 6/1971 Horwinski ................. 337/415
4,372,693 A * 2/1983 Lutz ........................... 374/111
4,749,856 A * 6/1988 Walker et al. ............... 250/227
5,424,895 A * 6/1995 Gaston ......................... 361/46

FOREIGN PATENT DOCUMENTS

| JP | 58-82410 | 5/1983 |
| JP | 1-102776 | 7/1989 |
| JP | 07-004684 | 1/1995 |

* cited by examiner

Primary Examiner—Safet Metjahic
Assistant Examiner—Anjan K Deb
(74) Attorney, Agent, or Firm—Armstrong, Westerman & Hattori, LLP

(57) ABSTRACT

In a device for detecting the abnormality of a wire harness or a power supply device for a motor vehicle, a temperature fuse which blows out when a temperature exceeds a certain value is arranged within or adjacently to a wire harness. By detecting the presence or absence of break of the temperature fuse, abnormality of the wire harness is detected. Thus, deterioration of the wire harness due to rare short can be avoided.

8 Claims, 6 Drawing Sheets

DEVICE FOR DETECTING ABNORMALITY OF WIRE HARNESS FOR VEHICLE AND POWER SUPPLY DEVICE FOR VEHICLE

BACKGROUND OF THE INVENTION

1. Field of the Invention

The present invention relates to a device for detecting abnormal heat generation of a wire harness due to e.g. rare short-circuiting, and a power supply device for a vehicle which can detect abnormal heat generation to prevent attenuation of the wire harness.

2. Description of the Prior Art

Conventionally, in a motor vehicle, generally, power generated by a power source such as a battery or alternator is supplied to respective loads through a wire harness composed of a plurality of electric wires. The wire harness 1, as shown in FIG. 11, has a structure in which a large number of core wires la are covered with an insulating covering layer 1b. Namely, the wire harness is commonly converged and protected by fitting-over of soft vinyl chloride and tape winding so that current leakage form the core wires can be prevented.

The wire harness is generally connected to a fuse. This prevents breakage of each load and deterioration of electric wires due to an excessive current generated when a voltage in a power source such as a battery and an alternator is varied or dead short-circuiting of the electric wire occurs.

Such a connection between the wire harness and the fuse can be made using a fuse box 2 as shown in FIG. 12. The fuse box 2 includes a housing 5 of insulating heat-resistance resin and a fuse element 3 housed in the housing 5. The wire harness is connected to terminals 4a and 4b provided at both ends of the fuse element 3.

As shown in FIG. 13, generally, the fuse used for a vehicle is given such a blowout characteristic as it blows out instantaneously for the current not smaller than 200% of fuse rating and is given an endurance characteristic for a rushing current smaller than 200% of the fuse rating. Therefore, when the current smaller than 200% of the fuse rating flows, the fuse has a relatively long melting time.

In a vehicle, when the insulating film 1b of the wire harness 1 deteriorates owing to time passage, or is brought into contact with both edges of the vehicle, state of "dead short" or "rare short" (intermittent short) may result. In the case of the dead short, a large current flows through the fuse and hence the fuse blows out instantaneously. On the other hand, in the case of rare short, the fuse repeats heat generation and heat dissipation so that the time until the blowout is apt to be prolonged.

Therefore, if the rare short continues, the insulating film 1b of the wire harness 1 constitutes a heat storage body before the fuse melts down to raise the temperature. As a result, the insulating film 1b will be further deteriorated. The present invention has been accomplished in order to solve the problems described above.

SUMMARY OF THE INVENTION

A first object of the present invention is to provide an abnormality detecting device which can avoid deterioration of the wire harness due to the rare short.

A second object of the present invention is to provide a power supply device for a vehicle provided with such an abnormality detecting device.

In order to attain the first object of the present invention, there is provided a device for detecting abnormality of a wire harness for a motor vehicle comprising: a wire harness; a temperature fuse coupled with said wire harness, a corresponding region of the wire harness blowing out when abnormality occurs at a certain position of the wire harness; and means connected to the temperature fuse to detect presence or absence of break of the temperature.

In this configuration, since abnormality of the wire harness can be detected by detecting presence or absence of break of the temperature fuse, a device for detecting abnormality of the wire harness i.e. a temperature increase in of the wire harness due to rare short of the wire harness can be easily provided.

In order to attain the second object of the present invention, there is provided a power supply device for a vehicle comprising: a power supply; a wire harness connected to the power supply; a load to which a current is supplied through the wire harness; a temperature fuse coupled with said wire harness, a corresponding region of the wire harness blowing out when abnormality occurs at a certain position of the wire harness; and means connected to the temperature fuse to detect presence or absence of break of the temperature; and means for cutting off a current flowing through the wire harness when break of the temperature fuse is detected.

In this configuration, when the abnormality of the wire harness is detected by the abnormality detecting device, the current flowing through the wire harness can be forcibly cut off. This provides a power supply device which can avoid further deterioration of the wire harness.

The above and other objects and features of the present invention will be more apparent from the following description taken in conjunction with the accompanying drawings.

DESCRIPTION OF THE PREFERRED EMBODIMENT

Figure 1:
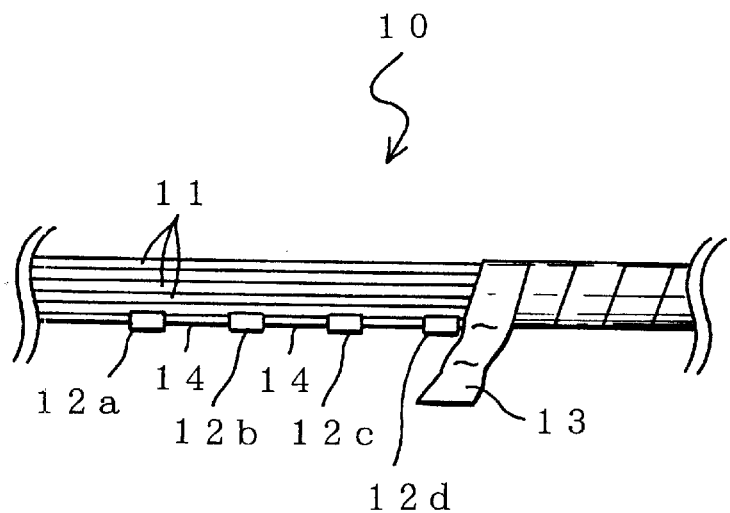
FIG. 1 is a schematic view of an arrangement of a wire harness used in an embodiment of the present invention.

Now referring to the drawings, an explanation will be given of an embodiment of the present invention.

In FIG. 1, a wire harness, generally 1 includes electric wires 11, temperature fuses 12a–12d arranged adjacent to the wires 11 and an insulating tape 13 wound around the periphery of the fuses.

The temperature fuses 12a–12d are made of a low melting point metal which may be an alloy of Sn, Pb and Bi or of Sn, Pb and In. In this embodiment, the blowout temperature of the temperature fuses 12a–12d is set at a temperature where the insulating film (not shown) of the wire harness 10 deteriorates greatly, e.g. 140–180° C.

Figure 2:
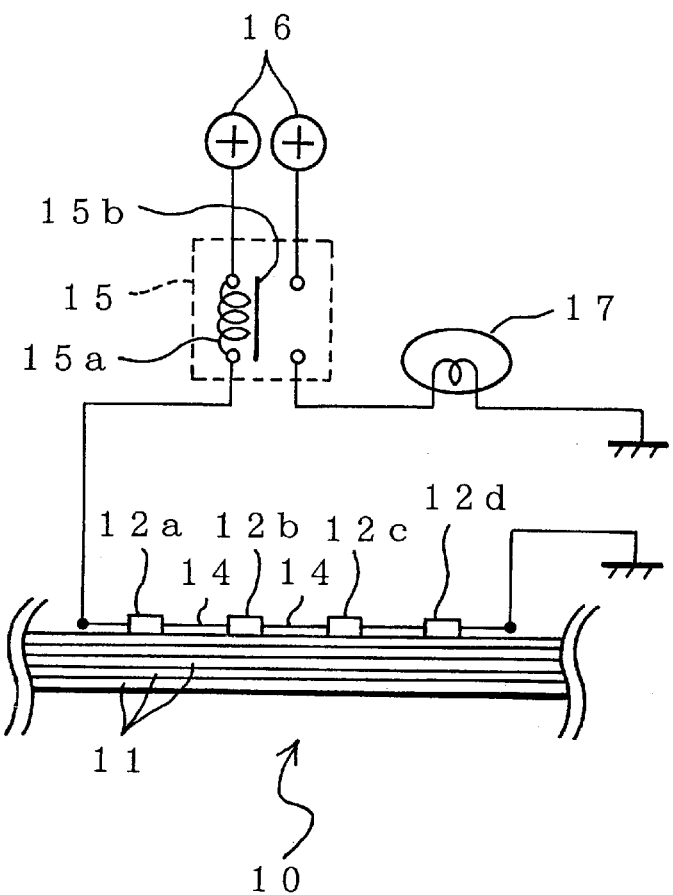
FIG. 2 is a schematic circuit diagram showing the arrangement of an abnormality detecting device according to the embodiment of the present invention.

FIG. 2 shows a circuit configuration of a device 20 for detecting abnormality of the wire harness 10. The detecting device 20 is designed so that a voltage applying circuit 20 applies a voltage to temperature fuses 12a–12d connected in series, through an electric wire 14, via an electromagnetic relay 15. Thus, a minute current is caused to flow through the temperature fuses 12a–12d.

If the wire harness 10 is in a normal state, a current flows through the coil 15a of the electromagnetic relay 15, electric wires 14 and temperature fuses 12a–12d so that the terminal plate 15b of the electromagnetic relay 15 is held-in an off state as shown in FIG. 2.

On the other hand, when the wire harness 10 suffers from rare short, its temperature rises and the temperature fuse 12a, 12b, 12c or 12d at the pertinent portion blows out. Thus, the current does not flow through the coil 15a, electric wire 14 and temperature fuses 12a–12d so that the terminal plate 15b is placed in the ON state. Then, since a voltage is applied to a warning lamp 17 from the voltage applying circuit 16, the warning lamp 17 is lit.

In this way, the abnormality detecting device 20 can inform a user of the fact that the temperature of the wire harness 10 has exceeded a prescribed temperature. Therefore, the user, by replacing the defective wire harness by a normal wire harness, can avoid further deterioration of the wire harness 10.

Figure 3:
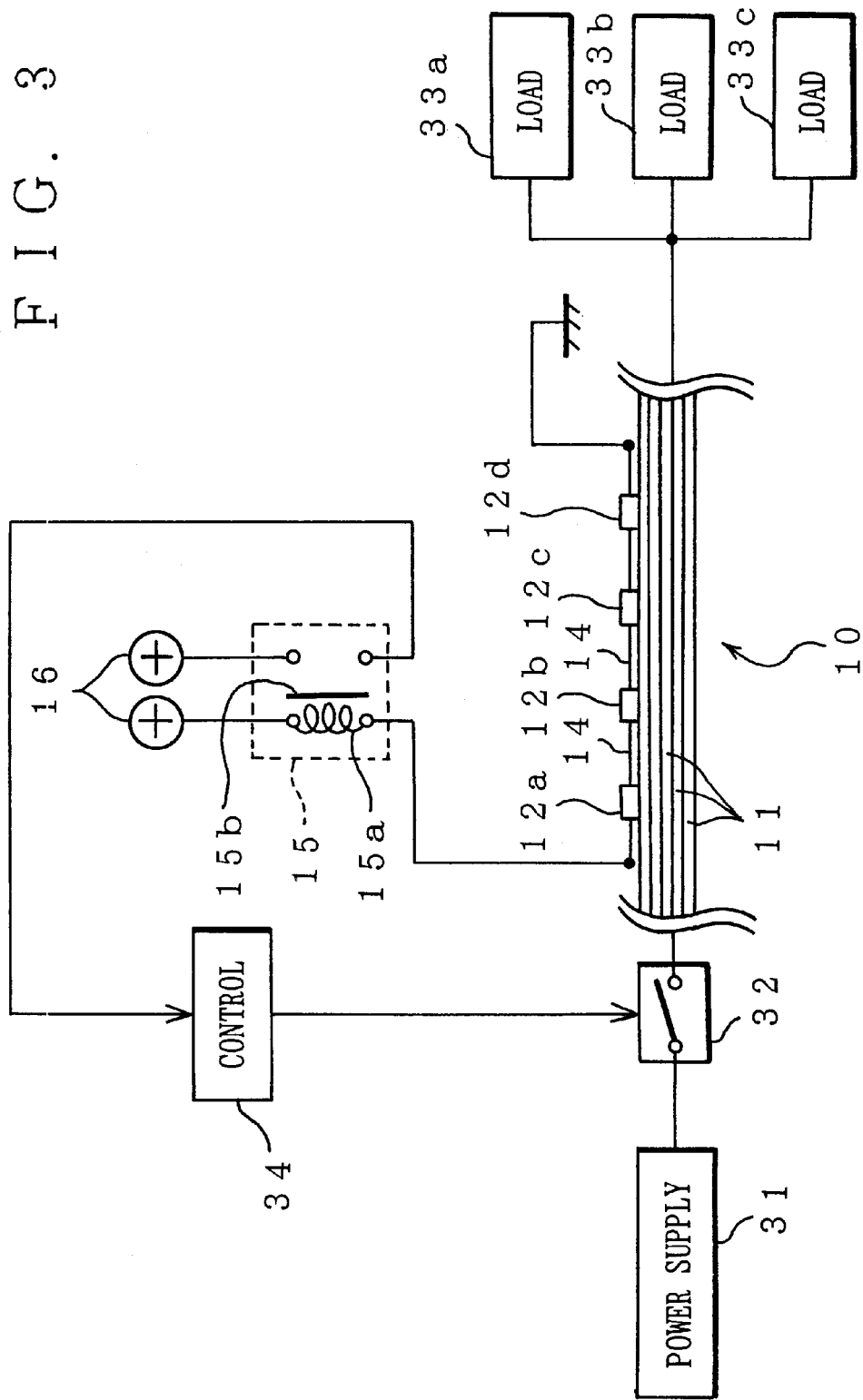
FIG. 3 is a circuit diagram showing the arrangement of a power supply device for a vehicle according to the embodiment of the present invention.

FIG. 3 shows an arrangement of a power supply device 30 for a vehicle. The power supply device 30 serves to supply power from a power source 31 such as a battery or alternator to each of loads 33a, 33b and 33c such as an air conditioner or various motors through the wire harness 10. On the wire harness 10, a power source switch 32 is provided which is controlled by a switching signal supplied from a control unit 32.

Now, when the switch 32 is turned on, a current from the power source 31 flows so that the current is supplied to the loads 33a–33c. Then, if the wire harness 10 is in a normal state, the current flows through the coil 15a of the electromagnetic relay 15, electric wire 14 and temperature fuses 12a–12d so that the terminal plate 15b of the electromagnetic relay 15 is held in an off state as shown in FIG. 3. Then, the control unit 34, to which a voltage is not applied, holds the switch 32 in the ON state.

On the other hand, when the wire harness 10 suffers from the rare short, its temperature rises and the temperature fuse 12a, 12b, 12c or 12d at the pertinent portion blows out. Thus, the current does not flow through the coil 15a, electric wire 14 and temperature fuses 12a–12d so that the terminal plate 15b is placed in the ON state. Then, the control unit 34 detects the voltage applied by the electromagnetic relay 15, and turns off the switch to interrupt the current to the wire harness 10.

In this way, when the temperature of the wire harness 10 exceeds a prescribed temperature, the power supply device 30 for a vehicle according to the present invention interrupts the current to the wire harness 10, thereby avoiding further deterioration of the wire harness 10.

Figure 4:
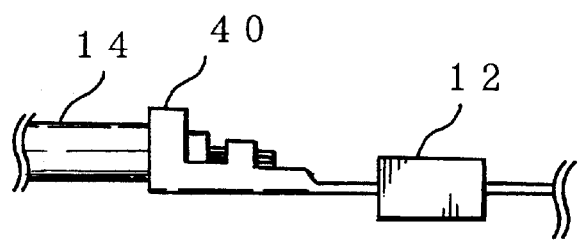
FIGS. 4–8 are side views each showing an exemplary connection between a temperature fuse and a wire for passing a current through the fuse.
Figure 5:
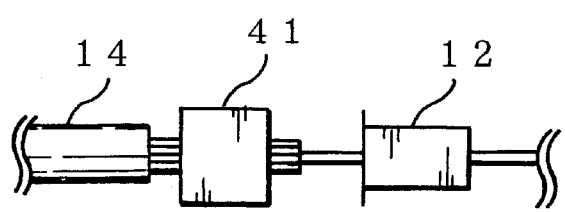

FIGS. 4 to 8 show manners of connecting the temperature fuse 12 (12a, 12b, 12c or 12d) to the electric wire 14 for passing a minute current through it. In the example of FIG. 4, the electric wire 14 and the temperature fuse 12 are connected to each other by crimping through a conductive crimping material 41 electrically connected to the temperature fuse 12. In the example of FIG. 5, they are connected to each other by crimping through a joint terminal 41.

Figure 6:
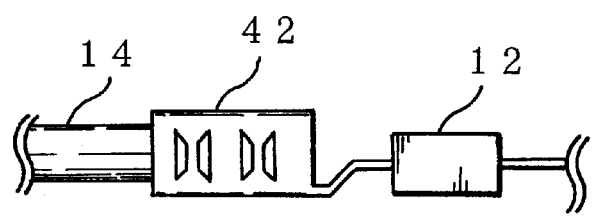
Figure 7:
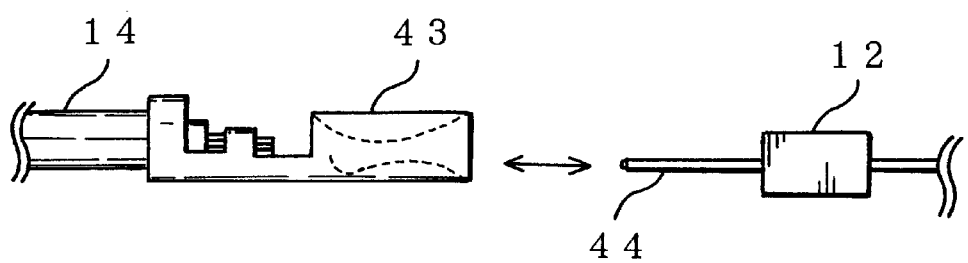
Figure 8:
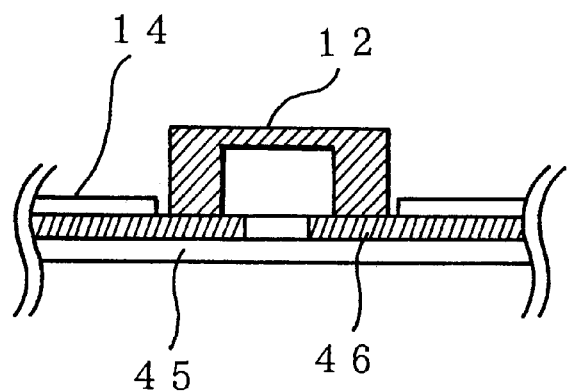
Figure 9:
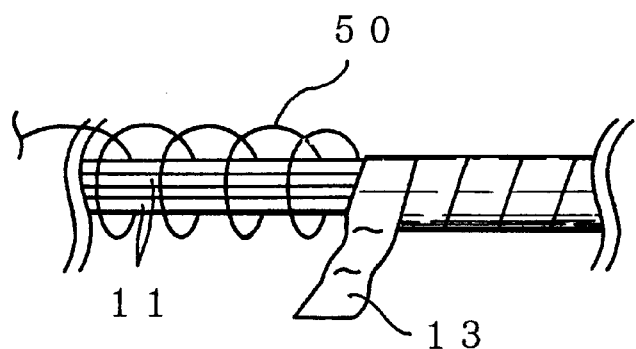
FIG. 9 is a schematic view showing an arrangement of a temperature fuse according to another embodiment of the present invention.

In the example of FIG. 6, they are connected by crimping through a conductive crimping terminal 42. In the example of FIG. 7, with the electric wire 14 equipped with a female terminal 43 and with the temperature fuse 12 equipped with a male terminal 44, they are connected to each other by inserting the female terminal into the male terminal 44. In the example of FIG. 8, with the electric wire 14 covered with an insulator 45 and equipped with areas partially cut of a conductor 46, the temperature fuse 12 is spanned across these cut areas of the conductor 46 by surface mounting.

Accordingly, in the configurations described above, the temperature fuses 12a–12d that blow out when the temperature exceeds a prescribed value are arranged in the wire harness 10, and the presence or absence of breaks of the wire is tested to detect the abnormality of the wire harness. Thus, a device 20 for detecting abnormality of the wire harness and a power supply device 30 for a motor vehicle can be realized which can avoid deterioration of the wire harness due to rare short of the wire harness 10.

In the embodiments described above, the plurality of temperature fuses 12a–12d were arranged in the interior of the wire harness 10. However, the present invention should not be limited to such an arrangement, but the temperature fuses 12a–12d may be arranged adjacently to the wire harness.

Figure 10:
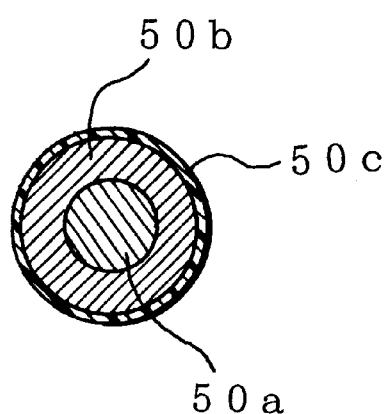
FIG. 10 is a sectional view of the temperature fuse in FIG. 9.
Figure 11:
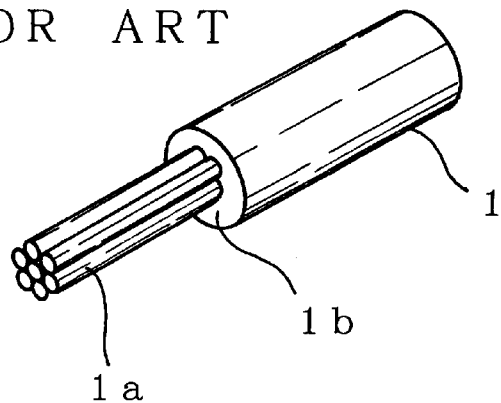
FIG. 11 is a perspective view of a general structure of a wire harness.
Figure 12:
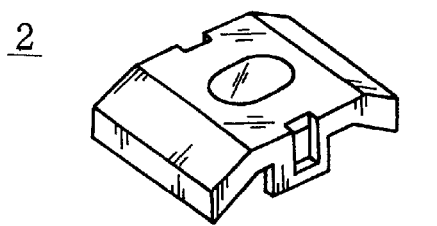
FIG. 12 is a perspective view of a fuse box.
Figure 12:
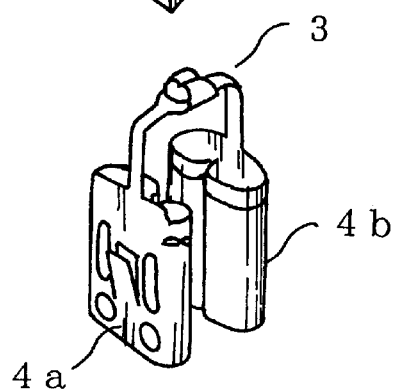
Figure 12:
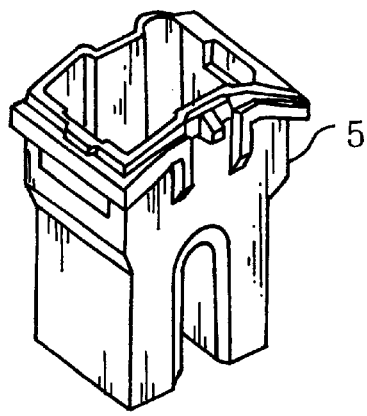
Figure 13:
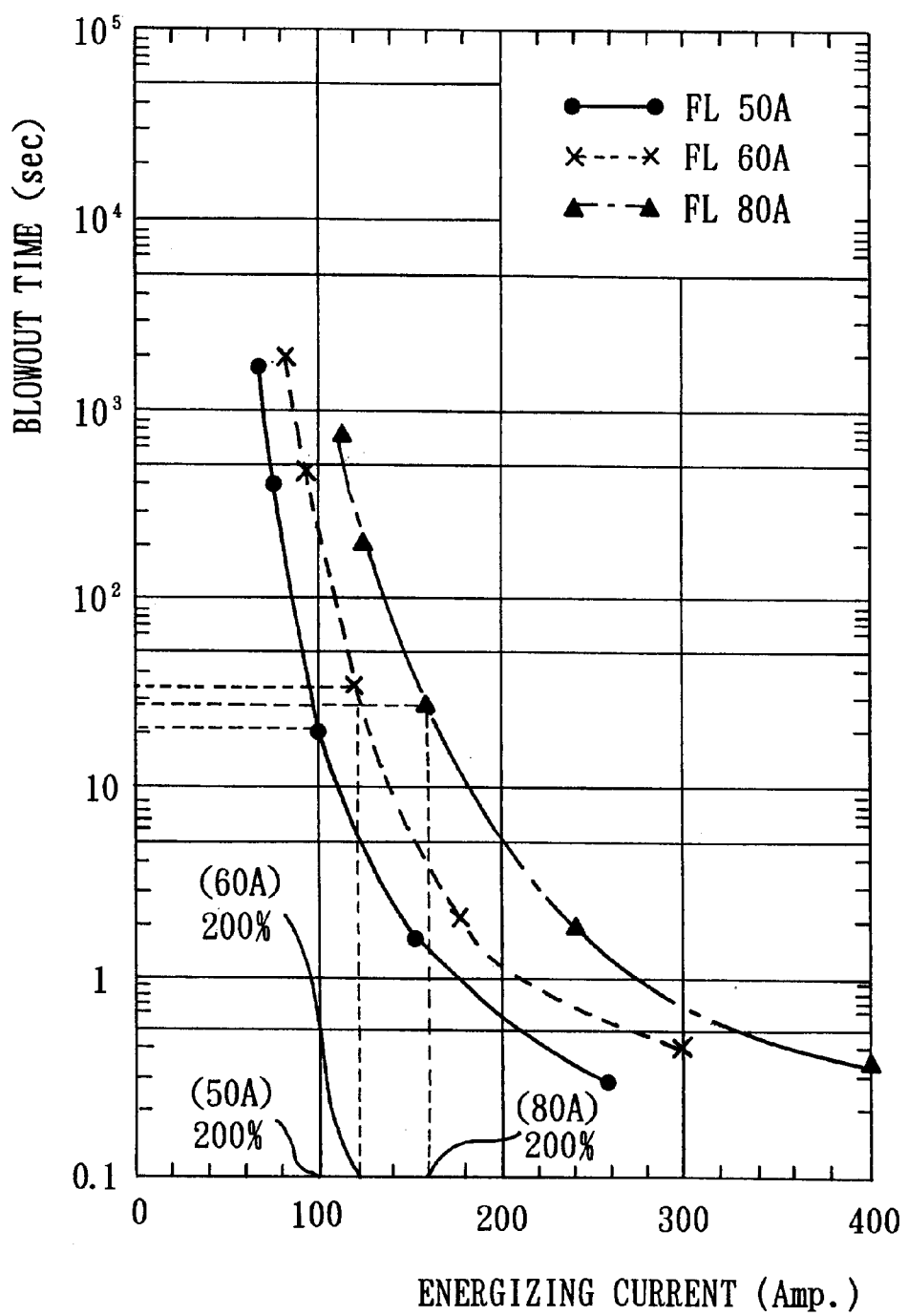
FIG. 13 is a graph showing the blowout characteristic of fuse used in a vehicle.

Further, in the embodiments described above, the plurality of temperature fuses 12a–12d were arranged along the longitudinal direction of the wire harness 10. However, the present invention should not be limited to such an arrangement, but as shown in FIG. 10, a temperature fuse 50 may be wound in a spiral fashion on the wire harness. Such a configuration can increase the area of detection by the temperature fuse. Therefore, when abnormality such as rare short occurs at any position of the wire harness so that the temperature of the wire harness rises, the temperature fuse at the pertinent position can be surely broken. This improves the accuracy of detection of abnormality in the wire harness.

In this case, winding of the temperature fuse wire 50 having such a sectional shape as shown in FIG. 10 in a spiral fashion permits the structure of the wire harness to be simplified.

Further, the temperature fuse line 50 may be arranged along the longitudinal direction of the electric wires 11 as in the embodiment.

As shown in FIG. 10, the temperature fuse wire 50 may be constructed to have a structure in which a low melting point metal 50a is covered with an insulating material 50c and flux 50b is filled between the low melting point metal 50a and the insulating material 50c. In such a configuration, when an ambient temperature rises, the flux 50b melts so that the ambient temperature is efficiently transmitted to the low melting point metal 50a. As a result, in good response to a rise in the ambient temperature (i.e. rise in the temperature of the wire harness), the low melting point metal 50a will be broken. Accordingly, abnormality of the wire harness can be detected with higher accuracy.

What is claimed is:

1. A device for detecting an abnormality of a wire harness for a motor vehicle comprising:
   an electrical wire harness;
   a plurality of individual temperature fuses connected in series through an electric wire, in a longitudinal direction of the wire harness and disposed adjacent to wires of the wire harness, having an insulating tape wound around the periphery thereof, a corresponding one of said fuses blowing out when temperature abnormality occurs at a certain position of the wire harness; and means connected to said temperature fuses connected in series to detect presence or absence of a blow out of one of the temperature fuses.

2. A device for detecting abnormality of a wire harness according to claim 1, wherein said temperature fuses are arranged in an interior or adjacently to the wire harness.

3. A device for detecting abnormality of a wire harness according to claim 1, wherein said temperature fuses are made of a low melting point metal.

4. A device for detecting an abnormality of a wire harness for a motor vehicle, comprising:

an electrical wire harness;

a plurality of temperature fuses wound spirally around the wire harness, having an insulating tape around the periphery thereof, a fuse of said plurality temperature fuses blowing out at a corresponding position when a temperature abnormality occurs at a certain position of the wire harness; and means connected to said fuse of said plurality of temperature fuses to detect presence or absence of a blow out of the temperature fuse; wherein said plurality of temperature fuses comprises a low melting point metal, an insulating material covering the low melting point metal, and flux disposed between the insulating material covering and the low melting point metal.

5. A power supply device for a vehicle comprising:

a power supply;

an electrical wire harness connected to the power supply;

a load to which a current is supplied through the wire harness;

a plurality of individual temperature fuses connected in series through an electrical wire, in a longitudinal direction of the wire harness and disposed adjacent to wires of the wire harness, having an insulating tape wound around the periphery thereof, a corresponding one of said fuses blowing out when temperature abnormality occurs at a certain position of the wire harness;

means connected to said temperature fuses connected in series to detect presence or absence of a blow out of one of the temperature fuses; and means for cutting off a current flowing through the wire harness when a break of a temperature fuse is detected.

6. A power supply device for a motor vehicle according to claim 5, wherein said temperature fuses are arranged in an interior or adjacently to the wire harness.

7. A power supply device for a motor vehicle according to claim 5, wherein said temperature fuses are made of a low melting point metal.

8. A power supply device for a motor vehicle, comprising:

a power supply;

an electrical wire harness connected to the power supply;

a load to which a current is supplied through the wire harness;

a plurality of temperature fuses connected in series, having an insulating tape wound around the periphery thereof, a corresponding one of said plurality of fuses blowing out when temperature abnormality occurs at a certain position of the wire harness;

means connected to said temperature fuses connected in series to detect presence or absence of a blow out of one of the plurality of temperature fuses; and means for cutting off a current flowing through the wire harness when a break of the temperature fuse is detected, wherein said temperature fuses are wound spirally around the wire harness in a longitudinal direction thereof, said plurality of temperature fuse comprises a low melting point metal, an insulating material covering the low melting point metal, and flux disposed between the insulating material covering and the low melting point metal.

* * * * *